United States Patent
Krampert et al.

(10) Patent No.: US 9,520,264 B2
(45) Date of Patent: Dec. 13, 2016

(54) METHOD AND APPARATUS FOR CLAMPING AND COOLING A SUBSTRATE FOR ION IMPLANTATION

(75) Inventors: Jeffrey E. Krampert, Topsfield, MA (US); Richard J. Hertel, Boxford, MA (US); John Robert Fairhurst, Plaistow, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1162 days.

(21) Appl. No.: 13/424,286

(22) Filed: Mar. 19, 2012

(65) Prior Publication Data

US 2013/0240759 A1    Sep. 19, 2013

(51) Int. Cl.
*H01J 37/20* (2006.01)
*H01J 37/317* (2006.01)
*H01L 21/687* (2006.01)
*H01L 21/67* (2006.01)
*C23C 14/22* (2006.01)
*C23C 14/50* (2006.01)
*C23C 14/54* (2006.01)

(52) U.S. Cl.
CPC .......... *H01J 37/20* (2013.01); *C23C 14/221* (2013.01); *C23C 14/50* (2013.01); *C23C 14/541* (2013.01); *H01J 37/3171* (2013.01); *H01L 21/67109* (2013.01); *H01L 21/68728* (2013.01); *H01L 21/68792* (2013.01); *H01J 2237/2001* (2013.01); *Y10T 29/49998* (2015.01)

(58) Field of Classification Search
USPC ......................................................... 269/903
See application file for complete search history.

(56) References Cited

U.S. PATENT DOCUMENTS

| | | | | |
|---|---|---|---|---|
| 5,449,182 A | * | 9/1995 | Petralia | B05C 13/025 242/571.2 |
| 5,503,446 A | * | 4/1996 | De Jong | G11B 23/00 294/100 |
| 5,533,614 A | * | 7/1996 | Walker | G11B 33/045 206/308.1 |
| 5,611,426 A | * | 3/1997 | Warfield | B65D 5/4204 206/308.1 |

(Continued)

FOREIGN PATENT DOCUMENTS

| | | | | | |
|---|---|---|---|---|---|
| FR | WO 2004054755 A2 | * | 7/2004 | | B23Q 7/043 |
| JP | WO 2013069088 A1 | * | 5/2013 | | H01L 21/67383 |
| WO | WO 2009089552 A2 | * | 7/2009 | | H01L 21/67383 |

*Primary Examiner* — Alvin Grant

(57) ABSTRACT

A system and method are disclosed for holding and cooling substrates during processing. A substrate clamp has an engagement portion for engaging a substrate about the inside diameter as well as a portion of the substrate surface immediately adjacent to the inside diameter. The clamp has a retracted position which enables the engagement portion to fit through the substrate ID, and an expanded position which enables the engagement portion to engage the substrate ID and the substrate surface immediately adjacent to the inside diameter. The clamp can include a conformal coating to enhance engagement between the substrate and the engagement portion. The clamp can also include an energy absorbing coating on one or more surfaces to maximize the absorption of radiative energy emitted from the substrate. Other embodiments are described and claimed.

15 Claims, 9 Drawing Sheets

(56) References Cited

U.S. PATENT DOCUMENTS

| | | | | |
|---|---|---|---|---|
| 5,669,644 A | * | 9/1997 | Kaihotsu | H01L 21/68707 294/213 |
| 5,829,759 A | * | 11/1998 | Swain | B65G 47/908 118/500 |
| 5,950,822 A | * | 9/1999 | Cloran | G11B 33/0427 206/308.1 |
| 6,010,171 A | * | 1/2000 | Margiottiello | B66C 1/54 294/86.25 |
| D421,870 S | * | 3/2000 | Boucard | D6/407 |
| 6,052,352 A | * | 4/2000 | Liou | G11B 17/056 720/603 |
| D430,424 S | * | 9/2000 | Belden, Jr. | D6/407 |
| 6,164,445 A | * | 12/2000 | Cooper | G11B 33/0427 206/308.1 |
| D469,768 S | * | 2/2003 | Marsilio | D14/407 |
| 6,715,607 B2 | * | 4/2004 | Wetsch | G11B 33/0427 206/308.1 |
| 6,766,910 B1 | * | 7/2004 | Kelly | A47F 7/0057 211/163 |
| 6,799,677 B2 | * | 10/2004 | Marsilio | G11B 33/045 206/308.1 |
| 6,951,278 B2 | * | 10/2005 | Pettigrew | G11B 33/0427 206/308.1 |
| 7,104,578 B2 | * | 9/2006 | Hartog | H01L 21/67383 294/183 |
| 8,128,336 B2 | * | 3/2012 | Kramp | G11B 17/028 294/100 |
| 2002/0024225 A1 | * | 2/2002 | Ostholt | B23Q 7/043 294/94 |
| 2014/0145581 A1 | * | 5/2014 | Jerez | H01J 37/3171 313/36 |

* cited by examiner

METHOD AND APPARATUS FOR CLAMPING AND COOLING A SUBSTRATE FOR ION IMPLANTATION

BACKGROUND OF THE INVENTION

Field of the Invention

Embodiments relate to the field of device manufacturing. More particularly, the present disclosure relates to an improved method and apparatus for clamping and cooling a substrate during ion implantation.

Discussion of Related Art

Attempts have been made to automate substrate processing in which an automated substrate transfer system removes one or more substrates from the cassette and transfers the substrates to a processing chamber where one or more deposition, implantation or other treatment processes can be performed.

A problem with current automated systems is that the handling components often grip the substrates on their outside diameter (i.e., via a spring) and/or they contact the substrate face, which understandably can damage the substrate. These gripping arrangements can also be unreliable and can result in the substrate slipping out of engagement with the gripping component, which can damage the substrate.

In addition, the process of ion implantation causes the substrate to heat up due to the interaction of the implanted ions and the substrate material. Process specifications typically require that the substrates not be heated above a certain maximum value during ion implantation in order to maintain substrate integrity. Current arrangements do not provide for cooling of the substrates during implantation. Thus, when a substrate reaches (or approaches) its temperature limit, implantation must be stopped, and the substrate must be allowed to cool prior to resuming the implant process. This cooling process is time intensive and reduces overall process throughput.

Thus, there is a need for an improved system and method for handling substrates for ion implantation. The system and method should provide reliable substrate engagement so as to minimize the chance for damage to occur to the substrate, either through dropping, or through contact with one or both of the substrate faces. The system and method should also provide a way to cool the substrate during the ion implantation process to enable implantation to occur for longer periods without stopping.

SUMMARY OF THE INVENTION

A system and method are disclosed for engaging a substrate during ion implantation procedures. The system and method provide positive engagement of the substrate without damaging. The system and method also provide active cooling of the substrate during ion implantation in order to extend the period during which implantation can occur.

A substrate clamping assembly is disclosed for holding a substrate having an inside diameter (ID) during processing. The clamping assembly can include a substrate support portion configured to support a portion of the bottom face of the substrate disposed immediately adjacent to the ID. A clamp portion may be configured to releasably engage a top face of the substrate disposed immediately adjacent to the ID. A clamp actuator may be disposed for reciprocal movement between first and second positions within the clamp portion. The first position of the clamp actuator may correspond to an engaged configuration of the clamping assembly, and the second position of the clamp actuator may correspond to a non-engaged configuration of the clamping assembly. Thus, arranged, the substrate is clamped between the substrate support portion and the clamp portion when the clamping assembly is in the engaged configuration, and the substrate is removable from the substrate support portion when the clamping assembly is in the non-engaged configuration.

A method is disclosed for holding a substrate having an inside diameter (ID) during processing, the method comprising: positioning the substrate on a substrate support portion such that the substrate support portion contacts a portion of the bottom face of the substrate disposed immediately adjacent to the ID; moving a clamp portion from a radially retracted position to a radially expanded configuration so that the clamp portion contacts a portion of the top face of the substrate disposed immediately adjacent to the ID; and processing the substrate.

A substrate clamping assembly is disclosed for holding and cooling a substrate having an inside diameter (ID) during processing. The clamping and cooling assembly can include a substrate support portion configured to support a first portion of the bottom face of the substrate, a clamp portion configured to releasably engage a second portion of the top face of the substrate and a clamp actuator disposed for reciprocal movement between first and second positions within the clamp portion. The first position of the clamp actuator may correspond to an engaged configuration of the clamping assembly, and the second position of the clamp actuator may corresponding to a non-engaged configuration of the clamping assembly. The assembly may further include a cooling arrangement thermally coupled to at least one of the substrate support portion, the clamp portion and the clamp actuator. Thus arranged, the substrate is clamped between the substrate support portion and the clamp portion when the clamping assembly is in the engaged configuration. In addition, the first portion of the bottom face and the second portion of the top face comprise an annular surface region surrounding the substrate ID to enable conductive cooling of the substrate via the cooling arrangement.

BRIEF DESCRIPTION OF THE DRAWINGS

For a better understanding of the present disclosure, reference is made to the accompanying drawings, which are incorporated herein by reference and in which.

DESCRIPTION OF EMBODIMENTS

Substrates can be transferred between a number of different housings and stations before and after processing evolutions such as ion implantation or plasma doping. For example, a cassette may be used to house a plurality of substrates for transport and storage. To undergo processing, the substrates are transferred from a cassette to another holding device, an example of which is often referred to as a front opening unified pod, or "FOUP." The substrates may then be removed from the FOUP and transferred to a processing chamber where they can undergo one or more processing steps.

Figure 1:
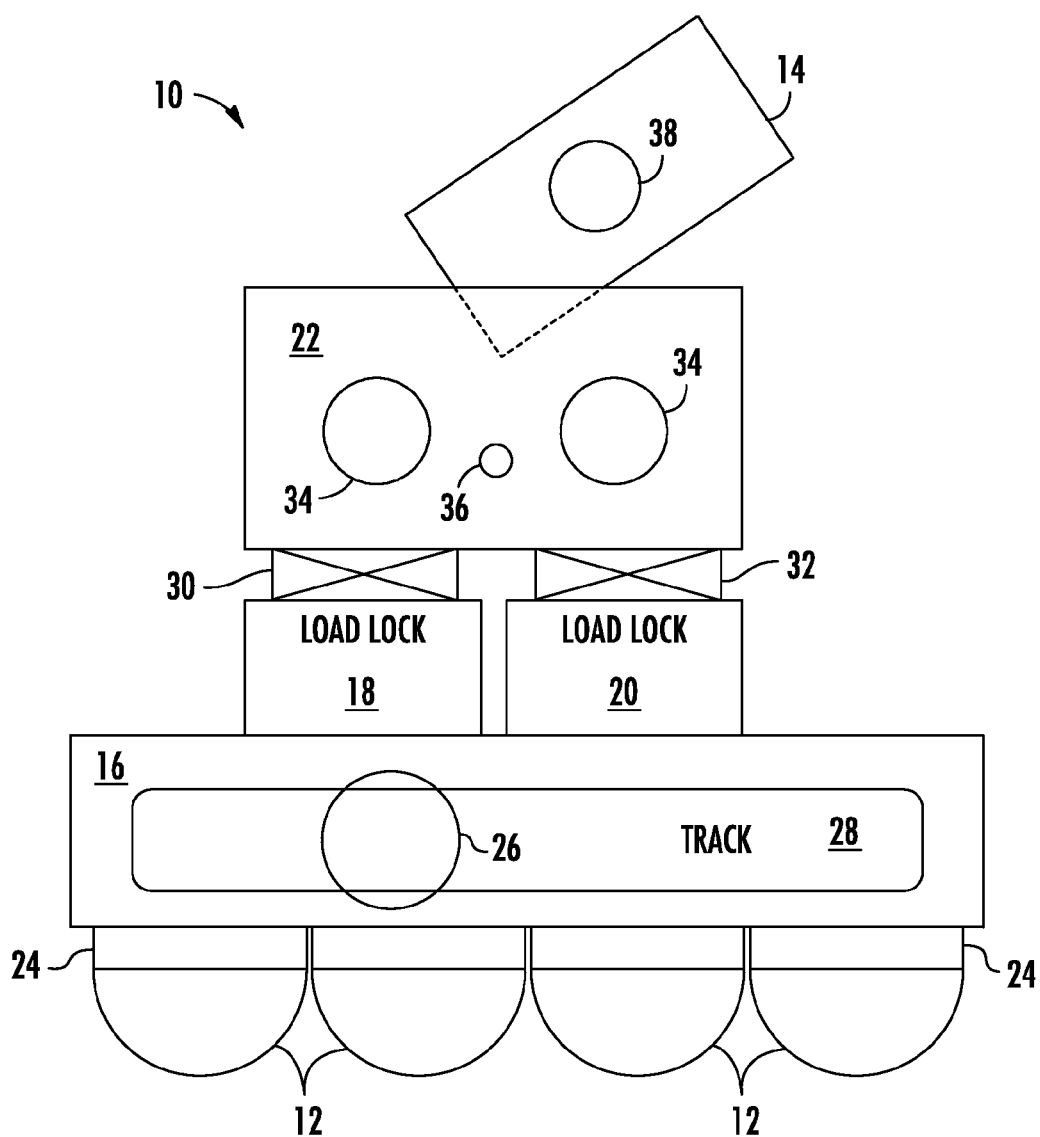
FIG. 1 is a schematic diagram of an exemplary substrate handling system.
Figure 2:
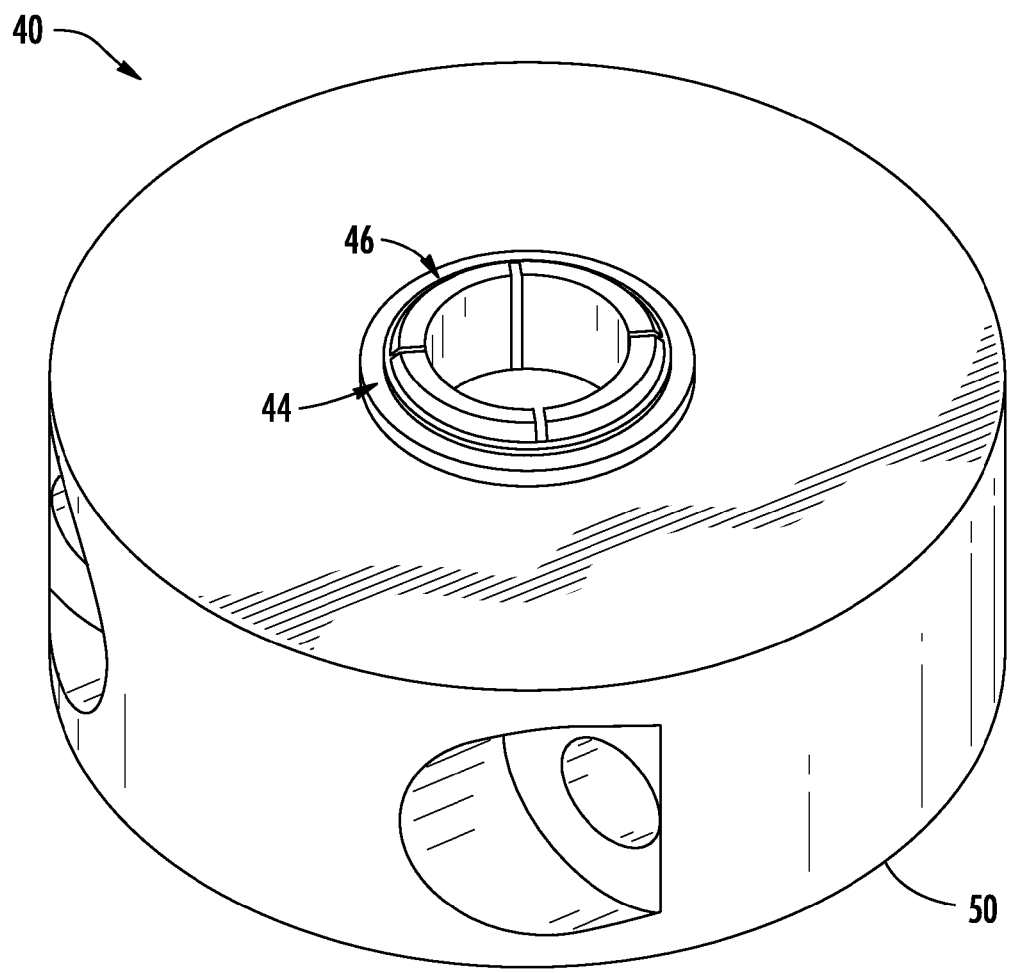
FIG. 2 is an isometric view of an exemplary clamp for use with the substrate handling system of FIG. 1.
Figure 3:
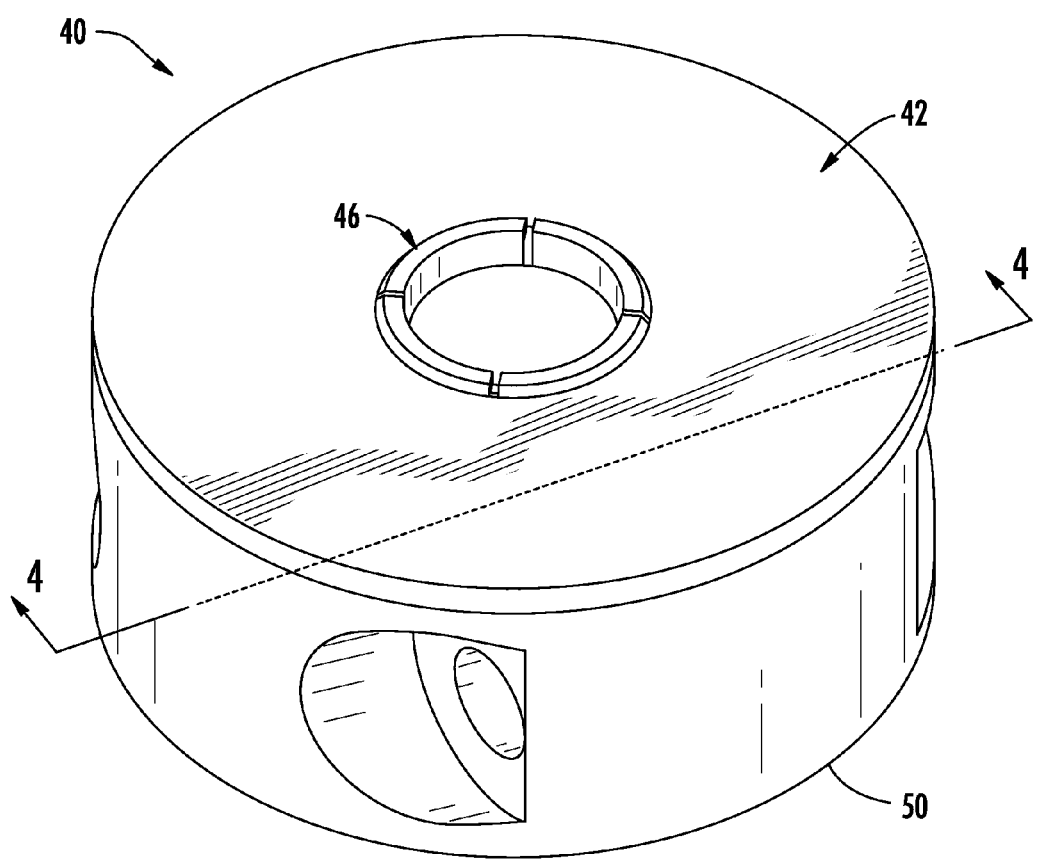
FIG. 3 is an isometric view of the clamp of FIG. 2 engaged with an exemplary substrate.

FIG. 1 shows an exemplary substrate handling system 10 in which a plurality of FOUPs 12 each hold a plurality of substrates (not shown). The substrates are transferred from the FOUPs 12 to a process chamber 14 via a buffer chamber 16, load locks 18 and 20 and a substrate handler chamber 22. Pod doors 24 interface the between the FOUPs 12 and the buffer chamber 16 so that substrates can pass between the FOUPs 12 and buffer chamber 16. In buffer chamber 16, an atmospheric robot 26 transports substrates along a track 28 to move substrates between the FOUPs 12 and load locks 18 and 20. The buffer chamber 16 may be at or near atmospheric pressure, and provides a controlled, low particulate environment. The load locks 18 and 20 communicate with substrate handler chamber 22 through isolation valves 30 and 32, respectively. The substrate handler chamber 22 may include one or more vacuum robots 34 and a substrate alignment station 36. A substrate is transferred by one of the robots 34 from one of the load locks 18, 20 to substrate alignment station 36. The substrate then is transferred to a process station 38 in process chamber 14 wherein it undergoes one or more processing steps, such as ion implantation or plasma doping.

As will be appreciated, the process station 38 includes apparatus for holding the substrates in a desired position during the one or more process steps. FIGS. 1-7 show an exemplary clamping assembly 40 for holding a substrate 42 in the process station 38. In some embodiments, the substrate 42 may have an outer diameter "OD" and an inner diameter "ID," (see FIG. 8) and the clamping assembly 40 may engage the substrate 42 on and/or adjacent to the ID. Substrates of this type may be used as hard disk drives for computers and other related equipment. Since contact with substrate can cause damage to the substrate, it is desirable to contact the substrates only on the ID and a small portion of the substrate face surrounding the ID. In some embodiments, this small portion of the substrate faces surrounding the ID may be an annulus portion "A" having a width "aw" (see FIG. 8). In one exemplary embodiment, the annulus width "aw" is about 2 millimeters.

As will be described, the clamping assembly 40 may include a support portion 44 on which the substrate 42 is mounted, such that only the annulus portion "A" of the bottom face 42A contacts the support surface. A clamp portion 46 may extend through the ID of the substrate 42 and may contact an annulus portion "A" of the top face 42B of the substrate 42, sandwiching the substrate and holding it in place during subsequent processing. A base portion 50 may be provided to engage and hold the support portion 44 and the clamp portion 46.

Figure 4:
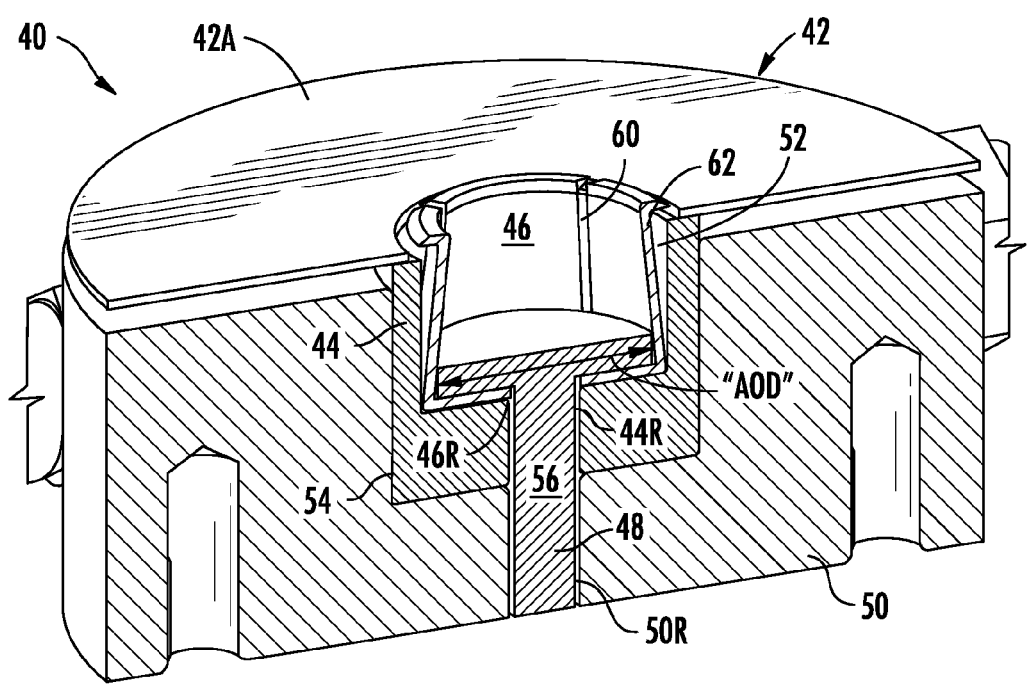
FIG. 4 is a cutaway view of an exemplary clamp for use with the substrate handling system taken along line 4-4 of FIG. 3, the clamp shown in the non-engaged position.
Figure 5:
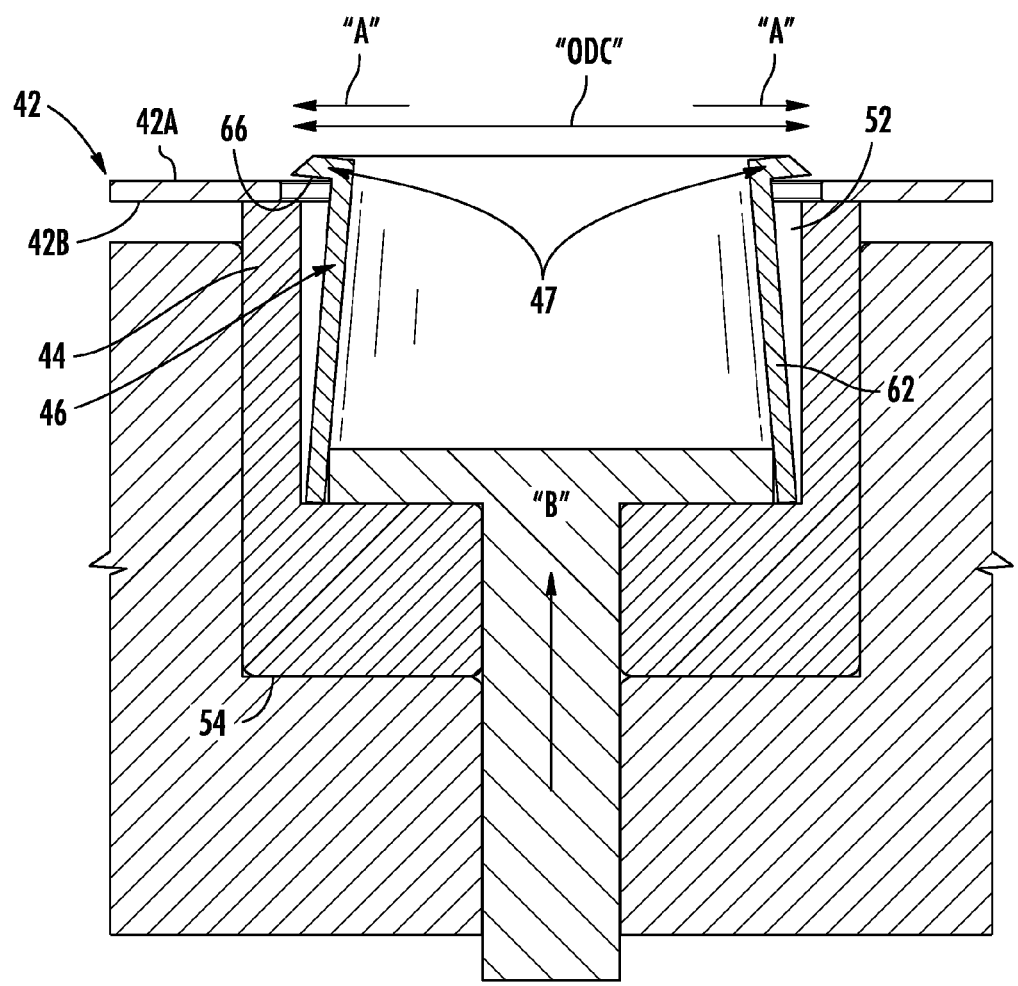
FIG. 5 is a partial cross-section view of the clamp of FIG. 4.
Figure 6:
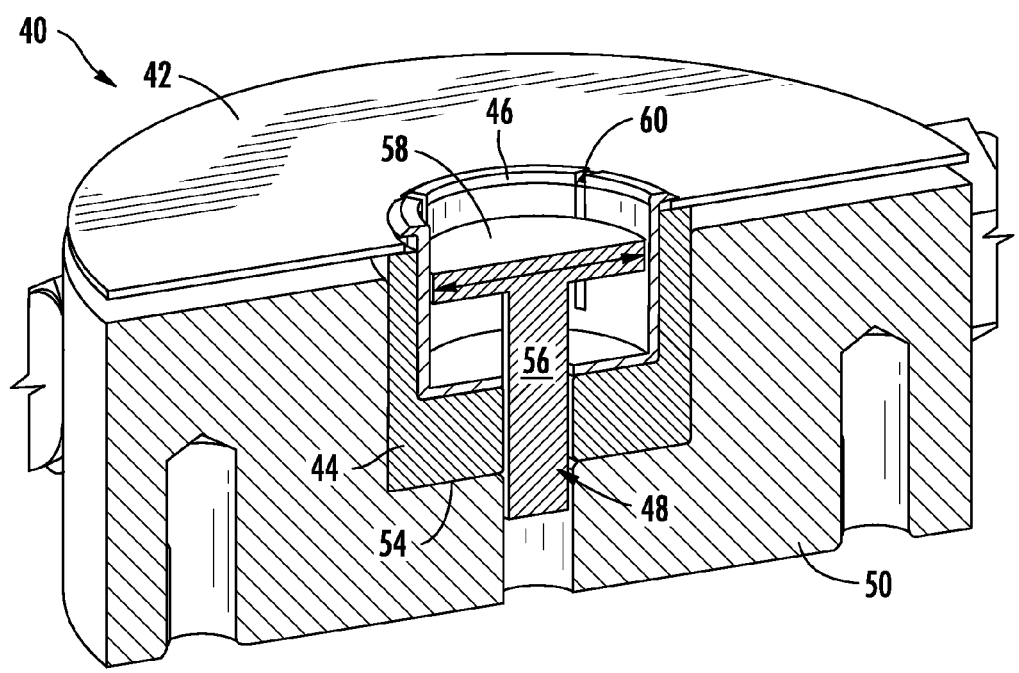
FIG. 6 is a cutaway view of the clamp of FIG. 2 taken along line 4-4 of FIG. 3, the clamp shown engaged with an exemplary substrate.
Figure 7:
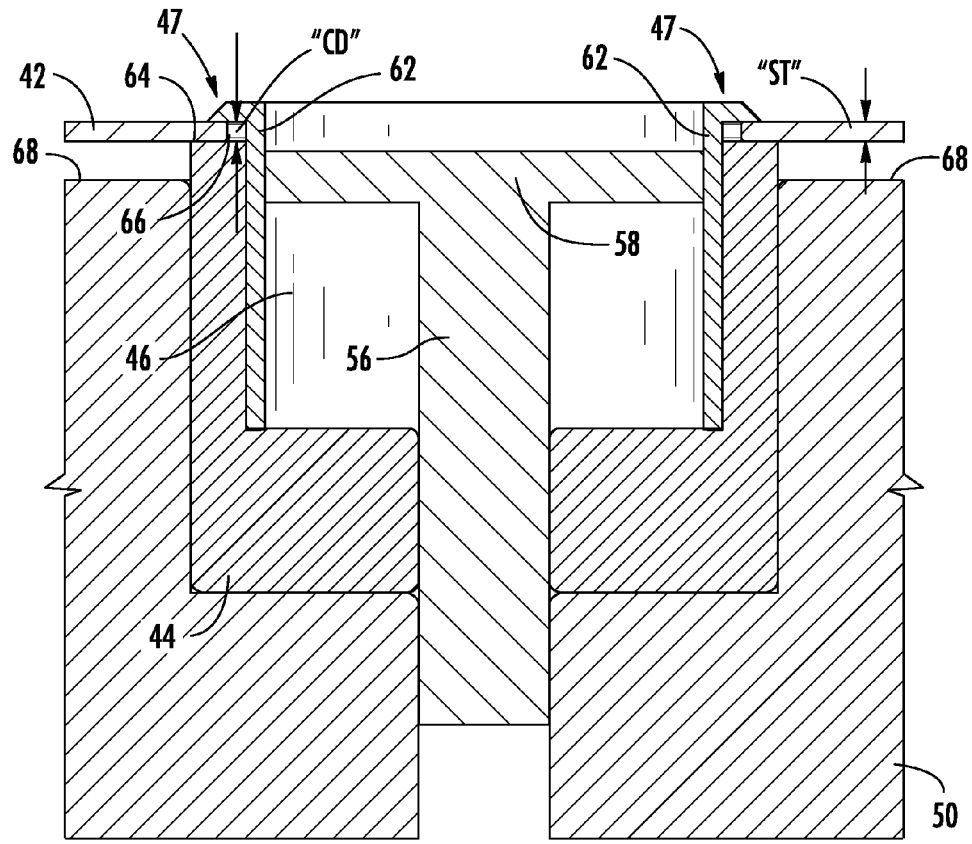
FIG. 7 is a partial cross-section view of the clamp of FIG. 6 engaged with a substrate.
Figure 8:
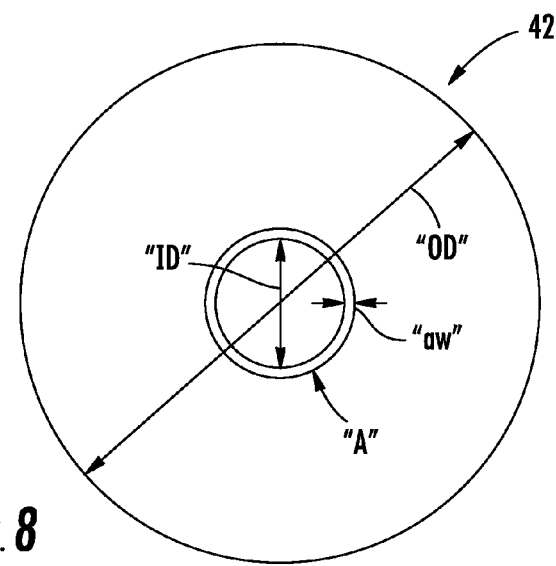
FIG. 8 is a plan view of an exemplary substrate.

FIGS. 4 and 5 show the clamping assembly 40 in the non-engaged configuration, while FIGS. 6 and 7 show the clamping assembly in the engaged configuration. Although not shown, a robot and/or substrate holder may be used to position the individual substrates 42 on the clamping assembly 40, and to remove the substrates from the clamping assembly 40 once processing is completed. An examplary substrate holder is disclosed in co-pending U.S. patent application Ser. No. 13/268,139, filed Oct. 7, 2011, titled "Method and Apparatus for Manipulating a Substrate," the entirety of which is incorporated herein by reference.

Referring again to FIGS. 4 and 5, the clamping assembly 40 generally includes a support portion 44, a clamp portion 46, a clamp actuator 48, and a base member 50. The support portion 44 is configured to engage a bottom face 42A of the substrate, while the clamp portion 46 is configured to engage a top face 42B of the substrate. As will be described in greater detail later, the support portion 44 and clamp portion 46 may also be actively cooled to remove heat from the substrate 42 during processing. As previously noted, providing such cooling may increase the amount of uninterrupted time an ion implanting process can be performed before exceeding a maximum permissible temperature for the substrate.

Referring again to FIGS. 4 and 5, the clamping assembly 40 is shown in the non-engaged configuration. As can be seen, when the substrate is placed on the support portion 44, the clamp portion 46 is in a radially retracted position such that an outside dimension "ODC" of the clamp portion 46 is smaller than the ID of the substrate 42. This enables the substrate 42 to be lowered down onto the support portion 44 (and also removed therefrom) without interference from the clamp portion 46. In the illustrated embodiment, the clamp portion 46 is an inwardly biased cylindrical member that is received with a recess 52 in the support portion 44. The support portion 44, in turn, may be a cylindrical member that is received within a recess 54 in the base member 50. The clamp portion, support portion and base member may be engaged with each other by any of a variety of known fastening techniques, such as threading, press-fit, and the like.

The clamp actuator 48 may have an actuating arm 56 that is reciprocally receivable within respective recesses 50R, 44R, 46R in the base member 50, the support portion 44 and the clamp portion 46, respectively. The clamp actuator 48 may also include an actuating portion 58 having an outside dimension "AOD" that is sized to enable it to reciprocate within the clamp portion 46.

As can be seen, the clamp portion 46 can include a series of vertically oriented slots 60 disposed about the circumference of the clamp portion 46. These slots 60 that enable the distal end 47 of the clamp portion 46 to radially expand and contract. In one embodiment, the clamp portion 46 is biased radially inward so that in its unforced position it assumes the unexpanded configuration shown in FIGS. 4 and 5. By moving the clamp actuator 48 upward within the clamp portion 46, however, the actuating portion 58 can engage the walls 62 of the clamp portion 46, forcing them outward in the direction of arrow "A" as the clamp actuator 48 moves in the direction of arrow "B." This movement of the clamp actuator 48 radially expands the clamp portion 46, moves the clamping assembly 40 from the non-engaged configuration of FIGS. 4 and 5 to the engaged configuration of FIGS. 6 and 7.

The actuating arm 56 of the clamp portion 46 may be coupled to an automated adjustment mechanism (not shown) that provides remote actuation of the actuator 48 to enable the clamping assembly 40 to be moved between engaged and non-engaged configurations, as desired.

FIGS. 6 and 7 show the clamping assembly 40 engaged with the top and bottom surfaces 42A, 42B of the substrate 42. Specifically, a support surface 64 of the support portion 44 receives the bottom surface 42A while a clamping surface 66 of the clamp portion 46 engages the top surface 42B. In this configuration, the outside dimension "ODC" of the clamp portion 46 is greater than the outside dimension "ODC" of the clamp portion in the non-engaged configuration of FIGS. 4 and 5. For the reasons previously described, the outside dimension of the support portion "ODS" and the outside dimension "ODC" of the clamp portion 46 (in the engaged configuration) are sized to ensure that the support surface 64 and the clamping surface 66 engage the substrate top and bottom surfaces 42A, 42B within the annulus region "A" (FIG. 8) of the substrate 42.

The support portion 44 and the clamp portion 46 are sized to so that when the clamp actuator 48 is moved in the direction of arrow "B" to position the clamping assembly 40 in the engaged position, the support surface 64 and the clamping surface 66 are offset by a clamping distance "CD" that is slightly smaller than the thickness "ST" of the substrate 42 in order to enhance the clamping force applied to the substrate. In some embodiments, the clamping distance "CD" may be slightly smaller than the thickness "ST" of the substrate 42 to provide enhanced clamping force to the substrate 42.

Figure 9A:
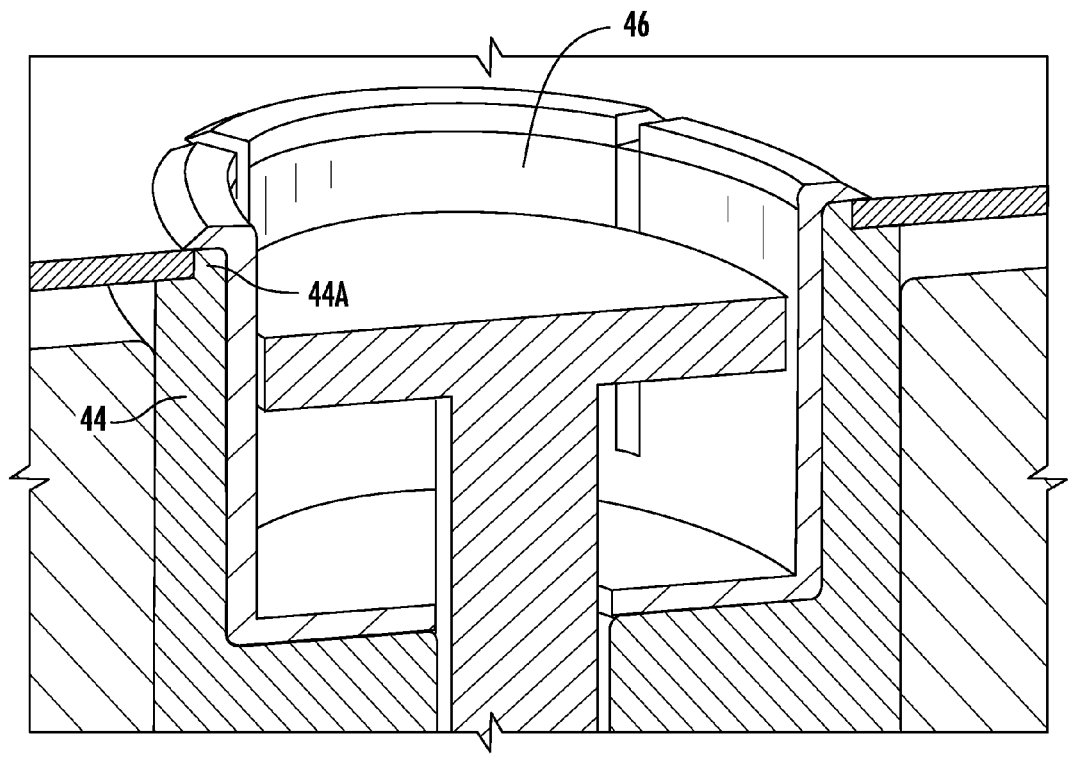
FIGS. 9A-C are detail cutaway and detail cross-section views of a portion of the clamp of FIG. 2, including an exemplary annular alignment lip on the substrate support portion.
Figure 9B:
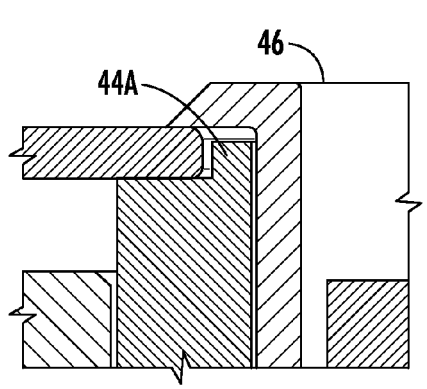
Figure 9C:
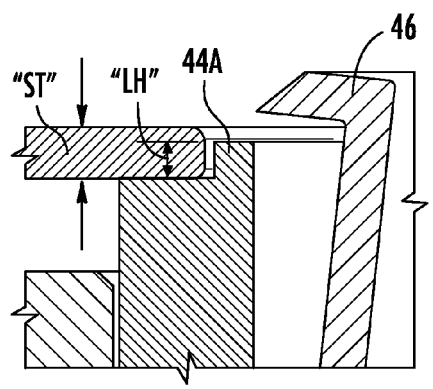

Although the support surface 64 is shown as being substantially flat, in some embodiments the support surface 64 may be angled downward and outward so as to center the substrate 42 on the support portion 44 when the substrate 42 is placed onto the clamping assembly 40 by the robot arm or substrate holder. As illustrated in FIGS. 9A-9C, the support surface 64 may also include an inner lip 44A formed as an annular ring. This inner lip 44A may facilitate centering of the substrate on the clamping assembly 40 prior to clamping by the clamp portion 46. The inner lip 44A may have an outer diameter "LOD" sized slightly smaller than the substrate ID so as to easily receive the substrate 42 on the support surface 64. The inner lip 44A may also have a lip height "LH" that is slightly smaller than the substrate thickness "ST" to ensure that the clamping surface 66 of the clamp portion 46 engages the substrate 42 during clamping.

To further facilitate engagement between the substrate 42 and the clamping assembly 40, one or both of the support surface 64 and the clamping surface 66 may include a resilient thermally conductive interface material. The conformal nature of the interface material may enhance the contact between the substrate and the support/clamping surface. In one non-limiting exemplary embodiment, the resilient thermally conductive interface material is silicone rubber. Alternatively, the interface material can be a layer of graphite (e.g., Graphoil®) or a heat spring material. In some embodiments, the resilient thermally conductive interface material may have a thickness of about 0.001 inches to about 0.005 inches.

As previously noted, the clamping assembly 40 may also include features that facilitate cooling of the substrate before, during or after one or more process steps. Such features can include any of a variety of active and passive cooling arrangements. For example, the base member 50 may include a substrate-facing surface 68 onto which is applied an energy absorbent coating (i.e., a black body emitter) that acts to maximize absorption of the radiative energy emitted by the hot substrate 42, and minimizes energy reflected back onto the substrate. Thus, the energy absorbent coating may have an emissivity of greater than about 0.90. In one embodiment, the energy absorbent coating may be an energy absorbent ceramic and/or glass material. The energy absorbent coating may be applied in a thickness of about 5-15 microns.

Active cooling features may also be provided. For example, one or more of the support portion 44, clamp portion 46, clamp actuator 48, and base member 50 can be subjected to coolant liquid flow so that heat conducted and/or convected from the substrate 42 can be carried away through the elements of the clamping assembly 40. In one embodiment, the coolant liquid is water. In a non-limiting exemplary embodiment, the water may be cooled to about 20 degrees Celsius (C) prior to contacting the water with one or more elements of the clamping assembly 40. Alternatively, cryogenic coolant may be employed, using liquid nitrogen, liquid helium or other appropriate cryogenic coolant fluid.

In some embodiments, the base member 50, support portion 44 and/or clamp actuator can include coolant channels for receiving a flow of coolant fluid therein. In other embodiments, a reservoir of coolant fluid may be provided in contact with the base member 50.

Thus, the disclosed clamping assembly actively cools the substrate during the implant process, maintaining the substrate below its maximum implant temperature, and enabling the user to implant for longer periods without stopping. Such an arrangement can thereby desirably increase manufacturing throughput.

Although a single clamping assembly 40 has been described for use in engaging a single substrate, it will be appreciated that in practical application a plurality of clamping assemblies 40 can be provided in an array (e.g., 5×5) so that a plurality of substrates 42 can be simultaneously engaged and cooled during processing.

The clamp 40 and its components, including the base member 50, support portion 44, clamp member 46 and clamp actuator 48 can be constructed from metal such as aluminum or stainless steel.

Figure 10:
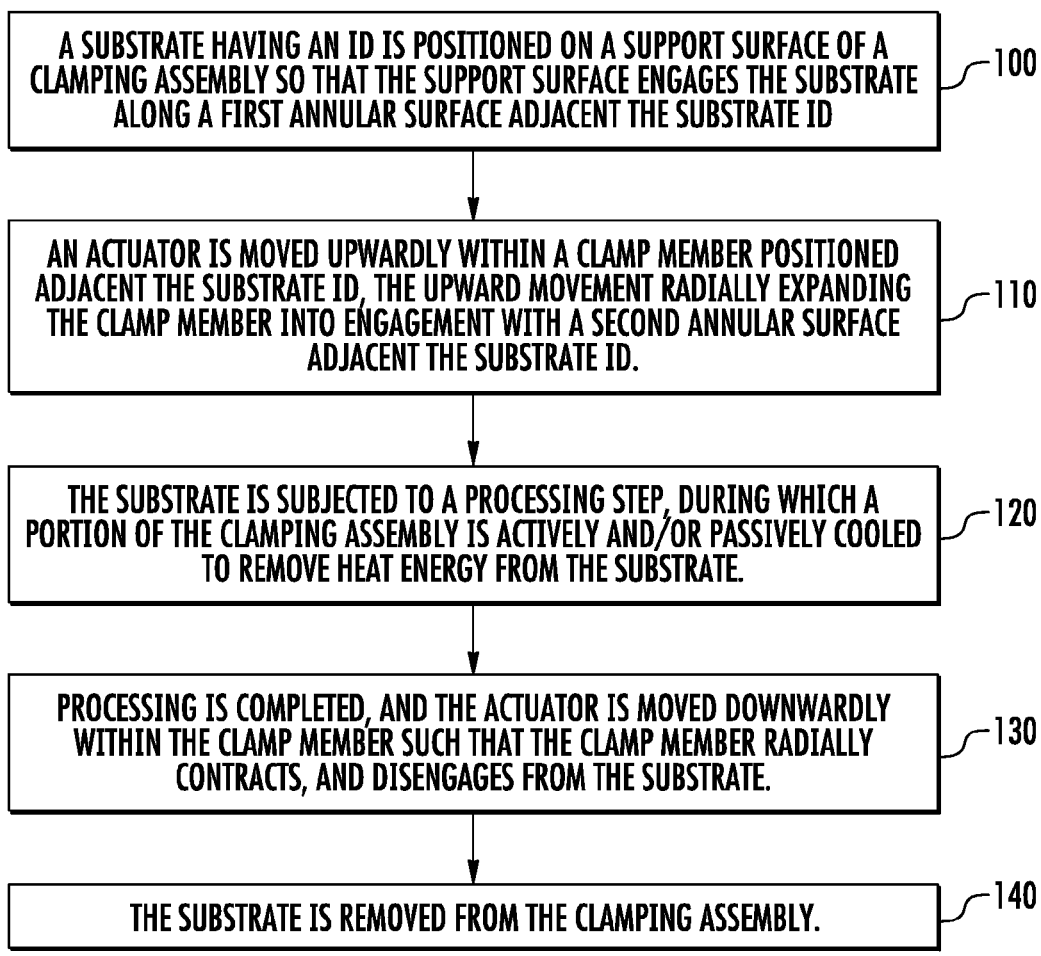
FIG. 10 is an exemplary logic flow according to one embodiment of the disclosed method.

An exemplary logic flow will now be described in relation to FIG. 10. At step 100, a substrate 42 having an ID is positioned on a support surface 64 of a clamping assembly 40 such that the support surface engages the substrate along a first annular surface adjacent the ID. At step 110 an actuator 48 is moved upwardly within a clamp member 46 positioned adjacent the substrate ID, the upward movement radially expanding the clamp member into engagement with a second annular surface adjacent the substrate ID. At step 120 the substrate is subjected to a processing step, during which a portion of the clamping assembly 40 is actively and/or passively cooled to remove heat energy from the substrate. At step 130, processing is completed, and the actuator 48 is moved downwardly within the clamp member 46 such that the clamp member 46 radially contracts, and disengages from the substrate. At step 140, the substrate 42 is removed from the clamping assembly 40.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate clamping assembly for holding a substrate having an inside diameter (ID) during processing, the clamping assembly comprising:
    a substrate support portion configured to support a portion of the bottom face of the substrate disposed immediately adjacent to the ID;
    a clamp portion configured to releasably engage a top face of the substrate disposed immediately adjacent to the ID; and
    a clamp actuator disposed for reciprocal movement between first and second positions within the clamp portion;
    wherein the first position of the clamp actuator corresponds to an engaged configuration of the clamping assembly, and the second position of the clamp actuator corresponds to a non-engaged configuration of the clamping assembly; and
    wherein the substrate is clamped between the substrate support portion and the clamp portion when the clamping assembly is in the engaged configuration, and the substrate is removable from the substrate support portion when the clamping assembly is in the non-engaged configuration,
    wherein the clamp portion comprises a cylindrical member having a plurality of slots, the clamp portion being inwardly biased so that an outer diameter of a first end of the clamp portion in the non-engaged configuration is smaller than an outer diameter of the first end of the clamp portion in the engaged configuration, and
    wherein the clamp portion comprises a cylindrical member having a plurality of slots, the clamp portion being inwardly biased so that an outer diameter of a first end of the clamp portion in the non-engaged configuration is smaller than an outer diameter of the first end of the clamp portion in the engaged configuration.

2. The clamping assembly of claim 1, wherein the substrate support portion and the clamp portion are engageable with the substrate on respective engagement surfaces, the engagement surfaces comprising a resilient polymer.

3. The clamping assembly claim 1, further comprising a base member, the support portion received within a recess in the base member and the clamp portion received within a recess in the support portion, wherein at least one of the base member, the support portion and the clamp portion include at least one coolant channel for receiving coolant fluid flow.

4. The clamping assembly of claim 1, further comprising a base member, the support portion received by the base member, the base member having a surface disposed adjacent to the bottom face of the substrate, the surface comprising a black body emitter coating for maximizing absorption of radiative heat energy from the substrate and for minimizing reflection of radiative heat energy from the substrate.

5. The clamping assembly of claim 4, wherein the black body emitter coating comprises a ceramic material.

6. A substrate clamping assembly for holding and cooling a substrate having an inside diameter (ID) during processing, the clamping assembly comprising:
    a substrate support portion configured to support a first portion of the bottom face of the substrate;
    a clamp portion configured to releasably engage a second portion of the top face of the substrate;
    a clamp actuator disposed for reciprocal movement between first and second positions within the clamp portion, the first position of the clamp actuator corresponding to an engaged configuration of the clamping assembly, and the second position of the clamp actuator corresponding to a non-engaged configuration of the clamping assembly; and
    a cooling arrangement thermally coupled to at least one of the substrate support portion, the clamp portion and the clamp actuator;
    wherein the substrate is clamped between the substrate support portion and the clamp portion when the clamping assembly is in the engaged configuration; and
    wherein the first portion of the bottom face and the second portion of the top face comprise an annular surface region surrounding the substrate ID to enable conductive cooling of the substrate via the cooling arrangement.

7. The substrate clamping assembly of claim 6, wherein the cooling arrangement includes at least one coolant channel disposed in at least one of the substrate support portion, the clamp portion or the clamp actuator.

8. The substrate clamping assembly of claim 6, wherein the cooling arrangement includes a reservoir for receiving a coolant fluid.

9. The substrate clamping assembly of claim 6, wherein the clamp portion comprises a cylindrical member having a plurality of slots, the clamp portion being inwardly biased so that an outer diameter of a first end of the clamp portion in the non-engaged configuration is smaller than an outer diameter of the first end of the clamp portion in the engaged configuration.

10. The substrate clamping assembly of claim 9, wherein the clamp actuator comprises an actuating portion received within the clamp portion such that movement of the actuating portion towards the first end of the clamp portion expands the clamp portion to configure the clamp portion in the engaged configuration.

11. The substrate clamping assembly of claim 9, further comprising a base member, the support portion received by the base member, the base member having a surface disposed adjacent to the bottom face of the substrate, the surface comprising a black body emitter coating for maximizing absorption of radiative heat energy from the substrate and for minimizing reflection of radiative heat energy from the substrate.

12. The substrate clamping assembly of claim 6, wherein the substrate support portion and the clamp portion are engageable with the substrate on respective engagement surfaces, the engagement surfaces comprising a resilient polymer.

13. A substrate clamping assembly for holding a substrate having an inside diameter (ID) during processing, the clamping assembly comprising:
   a substrate support portion configured to support a portion of the bottom face of the substrate disposed immediately adjacent to the ID;
   a clamp portion configured to releasably engage a top face of the substrate disposed immediately adjacent to the ID; and
   a clamp actuator disposed for reciprocal movement between first and second positions within the clamp portion; and
   a base member, the support portion received within a recess in the base member and the clamp portion received within a recess in the support portion, wherein at least one of the base member, the support portion and the clamp portion include at least one coolant channel for receiving coolant fluid flow,
   wherein the first position of the clamp actuator corresponds to an engaged configuration of the clamping assembly, and the second position of the clamp actuator corresponds to a non-engaged configuration of the clamping assembly; and
   wherein the substrate is clamped between the substrate support portion and the clamp portion when the clamping assembly is in the engaged configuration, and the substrate is removable from the substrate support portion when the clamping assembly is in the non-engaged configuration.

14. A substrate clamping assembly for holding a substrate having an inside diameter (ID) during processing, the clamping assembly comprising:
   a substrate support portion configured to support a portion of the bottom face of the substrate disposed immediately adjacent to the ID;
   a clamp portion configured to releasably engage a top face of the substrate disposed immediately adjacent to the ID; and
   a clamp actuator disposed for reciprocal movement between first and second positions within the clamp portion; and
   a base member, the support portion received by the base member, the base member having a surface disposed adjacent to the bottom face of the substrate, the surface comprising a black body emitter coating for maximizing absorption of radiative heat energy from the substrate and for minimizing reflection of radiative heat energy from the substrate,
   wherein the first position of the clamp actuator corresponds to an engaged configuration of the clamping assembly, and the second position of the clamp actuator corresponds to a non-engaged configuration of the clamping assembly; and
   wherein the substrate is clamped between the substrate support portion and the clamp portion when the clamping assembly is in the engaged configuration, and the substrate is removable from the substrate support portion when the clamping assembly is in the non-engaged configuration.

15. The clamping assembly of claim 14, wherein the black body emitter coating comprises a ceramic material.

* * * * *